United States Patent [19]

Botez et al.

[11] Patent Number: 5,727,013

[45] Date of Patent: Mar. 10, 1998

[54] SINGLE LOBE SURFACE EMITTING COMPLEX COUPLED DISTRIBUTED FEEDBACK SEMICONDUCTOR LASER

[75] Inventors: Dan Botez; Masoud J. Kasraian, both of Madison, Wis.

[73] Assignee: Wisconsin Alumni Research Foundation, Madison, Wis.

[21] Appl. No.: 549,404

[22] Filed: Oct. 27, 1995

[51] Int. Cl.[6] .................................. H01S 3/08; H01S 3/19
[52] U.S. Cl. ................................................. 372/96; 372/45
[58] Field of Search ............................ 372/96, 46, 102, 372/45, 92

[56] References Cited

U.S. PATENT DOCUMENTS

| | | |
|---|---|---|
| 4,023,993 | 5/1977 | Scifres et al. . |
| 4,796,274 | 1/1989 | Akiba et al. ............................ 372/96 |
| 4,847,844 | 7/1989 | Noda et al. ............................ 372/45 |
| 4,860,298 | 8/1989 | Botez et al. ........................... 372/45 |
| 4,894,835 | 1/1990 | Uomi et al. . |
| 4,958,357 | 9/1990 | Kinoshita . |
| 4,975,923 | 12/1990 | Buus et al. . |
| 5,052,016 | 9/1991 | Mahbobzadeh et al. . |
| 5,086,430 | 2/1992 | Kapon et al. .......................... 372/45 |
| 5,170,405 | 12/1992 | Connolly et al. . |
| 5,208,824 | 5/1993 | Tsang .................................... 372/45 |
| 5,241,556 | 8/1993 | Macomber et al. . |
| 5,255,278 | 10/1993 | Yamanaka .............................. 372/45 |
| 5,263,041 | 11/1993 | Pankove . |
| 5,272,714 | 12/1993 | Chen et al. . |
| 5,295,150 | 3/1994 | Vangieson et al. . |
| 5,323,405 | 6/1994 | Kamiyama et al. ................... 372/45 |
| 5,329,542 | 7/1994 | Westbrook . |
| 5,345,466 | 9/1994 | Macomber . |
| 5,347,533 | 9/1994 | Higashi et al. ........................ 372/45 |
| 5,363,399 | 11/1994 | Yagi et al. ............................. 372/46 |
| 5,452,318 | 9/1995 | Makino et al. ........................ 372/45 |
| 5,536,085 | 7/1996 | Li et al. ................................. 372/46 |

OTHER PUBLICATIONS

H. Kogelnik, et al., "Coupled-Wave Theory of Distributed Feedback Lasers," J. Appl. Phys., vol. 43, No. 5, May 1972, pp. 2327–2335.

Charles H. Henry, et al., "Observation of Destructive Interference in the Radiation Loss of Second-Order Distributed Feedback Lasers, " IEEE Journal of quantumElectrics, vol. QE–21, No. 2, Feb. 1985, pp. 151–153.

Nils W. Carlson, et al., "Mode Discrimination in Distributed Feedback Grating Surface Emitting Lasers Containing a Buried Second-Order Grating," IEEE Journal of Quantum Electronics, vol. 27, No. 6, Jun. 1991, pp. 1746–1752.

Klaus David, et al., "Basic Analysis of AR–Coated, Partly Gain–Coupled DFB Lasers: The Standing Wave Effect," IEEE Journal of Quantum Electronics, vol. 28, No. 2, Feb. 1992, pp. 427–433.

Roel g. Baets, et al., "On the Distinctive Features of Gain Coupled DFB Lasers and DFB Lasers with Second–Order Grating," IEEE Journal of Quantum Electronics, vol. 29, No. 6, Jun. 1993, pp. 1792–1797.

Govind P. Agrawal and Nilay K. Dutta, *Semicondudctor Lasers* (book), Van Nostrand Reinhold, New York, 1993, pp. 41–43 and 319–384. (no month).

*Primary Examiner*—Rodney B. Bovernick
*Assistant Examiner*—Luong-Quyen T. Phan
*Attorney, Agent, or Firm*—Foley & Lardner

[57] ABSTRACT

A high power monolithic surface emitting semiconductor laser provides a single lobe far-field radiation profile which is emitted normal to the plane of a surface of the semiconductor laser structure. The semiconductor laser includes an active region layer at which light is emitted and a complex-coupled distributed feedback grating positioned to act upon light from the active region. The adjacent elements of the distributed feedback grating differ from one another in both refractive index and gain/loss. The grating period, or the combined width of the two adjacent grating elements, is selected to be equal to a full wavelength in the semiconductor structure of the light emitted from the active region. Lasing occurs in a symmetric mode, resulting in emission of light from a planar surface of the semiconductor structure perpendicular to the surface, the grating layer and the active region layer as long as the modal-gain difference between symmetric and antisymmetric modes due to optical-field overlap with the gain/loss grating overcomes the modal-gain difference based on radiation losses.

24 Claims, 10 Drawing Sheets

$$\mathcal{E}_f(z) = \mathcal{E}_{f0} + \delta\mathcal{E}_{f1}\cos(Kz+\Theta_1) + \delta^2\mathcal{E}_{f2}\cos(2Kz+\Theta_2)$$

$$g_f(z) = \delta^2[g_{f0} + g_{f1}\cos(Kz+\Phi_1) + g_{f2}\cos(2Kz+\Phi_2)]$$

S   Symmetric near field pattern
A   Antisymmetric near field pattern
○   Index-coupled
●   Complex-coupled (In-phase)

SINGLE LOBE SURFACE EMITTING COMPLEX COUPLED DISTRIBUTED FEEDBACK SEMICONDUCTOR LASER

FIELD OF THE INVENTION

This invention pertains generally to the field of semiconductor diode lasers and particularly to surface-emitting distributed feedback semiconductor lasers.

BACKGROUND OF THE INVENTION

Semiconductor diode lasers are formed of multiple layers of semiconductor materials. The typical semiconductor diode laser includes an n-type layer, a p-type layer and an undoped active layer between them such that when the diode is forward biased electrons and holes recombine in the active layer with the resulting emission of light. The layers adjacent to the active layer typically have a lower index of refraction than the active layer and form cladding layers that confine the emitted light to the active layer and sometimes to adjacent layers. Semiconductor lasers may be constructed to be either edge emitting or surface emitting. In one type of edge emitting semiconductor laser, crystal facet mirrors are located at opposite edges of the multilayer structure to provide reflection of the emitted light back and forth in a longitudinal direction, generally in the plane of the layers, to provide lasing action and emission of laser light from one of the facets. Another type of device, which may be designed to be either edge emitting or surface emitting, utilizes distributed feedback structures rather than conventional facets or mirrors, providing feedback for lasing as a result of backward Bragg scattering from periodic variations of the refractive index or the gain or both of the semiconductor laser structure. Such distributed feedback (DFB) lasers are discussed in, e.g., papers by H. Kogelnik, et al., "Coupled-Wave Theory of Distributed Feedback Lasers", J. Appl. Phys., Vol. 43, No. 5, May 1972, pp. 2327–2335; Charles H. Henry, et al., "Observation of Destructive Interference in the Radiation Loss of Second-Order Distributed Feedback Lasers," IEEE J. of Quantum Electronics, Vol. QE-21, No. 2, February 1985, pp. 151–153; Roel G. Baets, et al., "On the Distinctive Features of Gain Coupled DFB Lasers and DFB Lasers with Second Order Grating," IEEE J. of Quantum Electronics, Vol. 29, No. 6, June 1993, pp. 1792–1798; and Klaus David, et al., "Basic Analysis of AR-Coated, Partly Gain-Coupled DFB Lasers: The Standing Wave Effect," IEEE J. of Quantum Electronics, Vol. QE-28, No. 2, February 1992, pp. 427–433.

Since the early 70's, there has been interest in both theoretical and experimental studies of surface-emitting (SE) grating-coupled distributed-feedback (DFB) lasers. It has been demonstrated that $2^{nd}$-order SE-DFB lasers have attractive features such as dynamic single-mode operation, high output power, integrability with other optical components, and surface emission of light in directions substantially normal to the film waveguide. Second-order gratings provide both reflection of guided waves by means of second-order diffraction as well as radiation of free waves away from the film surface as a result of first-order diffraction. Consequently, second order SE-DFB lasers would appear to be good candidates for the realization of blue/green lasing by carrier injection from GaN-based structures, for which the implementation of conventional Fabry-Perot resonant cavities by wafer cleaving or dry chemical etching is not generally feasible due to the physical characteristics of the grown GaN-based structures. However, in surface emitting index coupled distributed feedback (IC-DFB) devices the radiation loss is the mode discriminator, and the mode of least radiation loss is invariably an asymmetric one, so that all such devices have operated with a two-peaked antisymmetric near-field pattern and a corresponding double-lobed far-field beam pattern. The latter feature is obviously not desirable for laser-array applications, since only half the emission can be used. Furthermore, due to the severe nonuniformity of the near-field intensity profile, IC-DFB lasers are rather vulnerable to gain spatial hole burning (GSHB), which in turns causes multimode operation.

Several methods for making the far-field pattern approach that of a single-lobed profile have been recently proposed. They include the incorporation of a phase-shifting film above the grating structure, chirping the grating structure, or preferential pumping. However, these methods, respectively, result in a non-monolithic structure, off-normal radiation, and reliance on the carrier-induced index depression, a fundamentally unreliable technique. Furthermore, all such structures have significantly nonuniform near-field intensity patterns, which makes them vulnerable to GSHB.

Edge-emitting complex-coupled (CC) DFB lasers consisting of periodic variations of both index and gain have recently received much attention. Such devices have several advantages over the conventional IC-DFB lasers. Some of these remarkable properties include high yield of single-longitudinal-mode operation, large gain threshold difference, reduced spatial hole burning effects, facet-reflectivity-independent characteristics, relatively low sensitivity to feedback, and a relatively small linewidth enhancement factor. The theoretical analyses of the CC-DFB lasers which have been reported have been for first-order Bragg-grating devices (i.e., edge emitters).

SUMMARY OF THE INVENTION

The present invention provides a high power surface emitting semiconductor laser with a single lobe far-field radiation profile which is normal to the plane of the surface, and a nearly uniform near-field intensity pattern. Single lobe, single frequency operation of the semiconductor laser can be achieved at high power levels with high efficiency. Further, the laser can be constructed utilizing a wide variety of material systems, including gallium nitride, to permit selection of desired laser light wavelengths, including light in the blue/green wavelengths.

The semiconductor laser of the invention is formed with a complex-coupled distributed feedback (CC-DFB) structure which includes regions of periodic variation of both refractive index and gain. As used herein, the term "gain" refers to the value of the optical mode gain or absorption (loss) at a particular location. In accordance with the present invention, such periodic variations are selected to form second order or higher even order periodic structures or gratings which meet the necessary Bragg condition. In particular, the grating period is selected to be equal to a full wavelength in the semiconductor structure (a second order DFB device) or multiples of a full wavelength. The grating is positioned to act upon light emitted from the active region in the semiconductor structure. For the complex coupled grating devices of the present invention, the periodic gain modulation favors lasing in the symmetric mode in spite of the relatively high radiation losses of this mode. It is found that the symmetric mode has a significantly larger gain overlap factor value than the antisymmetric mode, and that, above certain gain values, this better modal gain overlap more than compensates for the difference in radiation losses and thus causes the symmetric mode to have the lowest gain threshold. Under such conditions, emission of light occurs perpendicular to the plane of the grating from a planar face surface of the semiconductor laser device.

Semiconductor lasers in accordance with the present invention may be constructed of entirely monolithic structures. The periodic modulation of refractive index and gain may be incorporated in the active layer itself or, if a preferred structure, in layers adjacent to the active region layer. In one form of the latter structures, metal gratings having the desired spacing and variation in refractive index and gain can be formed on the surface of a layer of the semiconductor structure by patterning the metal on the surface of the semiconductor material to produce the grating.

A typical construction for a semiconductor laser in accordance with the invention provides a semiconductor structure including a substrate, an active region layer, cladding layers surrounding the active region layer, outer faces, electrodes by which voltage can be applied across the semiconductor structure, an opening in one electrode by which the light is emitted, and a region of periodically alternating elements in a layer formed on or in the semiconductor structure which defines a distributed feedback grating, the adjacent elements of the grating differing from one another in both index of refraction and gain, each pair of adjacent elements together having a width selected to be substantially equal to an integer multiple of the effective wavelength in the grating region of the favored mode of light emission.

Further objects, features and advantages of the invention will be apparent from the following detailed description when taken in conjunction with the accompanying drawings.

DETAILED DESCRIPTION OF THE INVENTION

Figure 1:
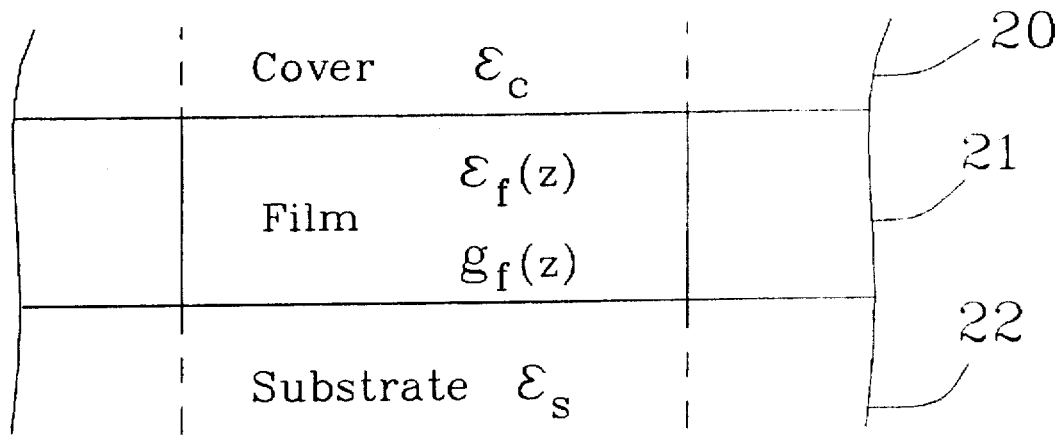
FIG. 1 is a schematic view of a semiconductor laser structure incorporating periodic variations of refractive index and gain in the active region layer.

For purposes of understanding the principles of the present invention, an analysis of the lasing characteristics of "in-phase," $2^{nd}$-order complex coupled-distributed feedback (CC-DFB) lasers is given below. To illustrate the basic operational characteristics of $2^{nd}$-order CC-DFB lasers, a simple three-layer dielectric structure is shown in FIG. 1 having spatial modulation of both the dielectric permittivity and the gain of the active layer (i.e., the film). Furthermore, since the behavior of $2^{nd}$-order DFB lasers in general depends only on the zeroth, first, and second harmonics of the grating profile, and is generally independent of the grating shape and the coupling mechanism, only the first three harmonics of the modulation functions are analyzed. The modulation of dielectric permittivity $\epsilon_f(z)$ and gain $g_f(Z)$ as a function of lateral position z in the film for purposes of the present analysis is given by the following equations:

$$\epsilon_f(z) = \epsilon_{f0} + \delta\epsilon_{f1} \cos(kz+\theta_1) + \delta^2 \epsilon_{f2} \cos(2kz+\theta_2)$$

$$g_f(z) = \epsilon^2[g_{f0} + g_{f1} \cos(kz+\phi_1) + g_{f2} \cos(2kz+\phi_2)]$$

where $\epsilon_{f0}, \epsilon_{f1}, g_{f0}, g_{f1}, g_{f2}$ are constants, $\delta$ indicates the order of smallness, $k=2\pi/\Lambda$ where $\Lambda$ is the grating period, and $\theta_1$, $\theta_2$, $\phi_1$, $\phi_2$ are selected phase angles.

Then, using the coupled-mode theory approximation, the governing equations for the slowly varying modal amplitudes of forward $[A^+(z)]$ and backward $[A^-(z)]$ traveling waves are obtained as:

$$\frac{d}{dz} A^+ = C_{31}A^+ + C_{32}A^- \quad (1)$$

$$-\frac{d}{dz} A^- = C_{41}A^+ + C_{42}A^- \quad (2)$$

where the coupling coefficients $C_{31}$ and $C_{42}$ provide information about the gain threshold, the Bragg-frequency deviation, and the radiation loss, while $C_{32}$ and $C_{41}$ provide the laser feedback as well as the radiation effects. Solution of these governing equations subject to classic boundary conditions [i.e., $A^+(z=0)=A^-(z=L)=0$] leads to the oscillation condition. From the complex solution of this relation, the gain threshold, Bragg-frequency deviation, and ultimately power-excitation efficiencies of the guided and radiated free waves of the longitudial modes are determined.

Unless otherwise mentioned, in the numerical examples that follow, it is assumed that the refractive index of the cover 20, film 21, and substrate 22 regions of the illustrative structure FIG. 1 are 3.3, 3.6, and 3.4, respectively; the film thickness equals 145 nm; and the grating length is 200 μm. The phase difference between the index and gain modulations (i.e., $\psi = \theta_{index} - \theta_{gain}$) can take any possible value from zero to $2\pi$. However, since a phase shift of zero or $\pi$ is experimentally more reliable, the CC-DFB lasers commonly are in either an in-phase (i.e., $\psi=0$) or an anti-phase (i.e., $\psi=\pi$) configuration.

Figure 2:
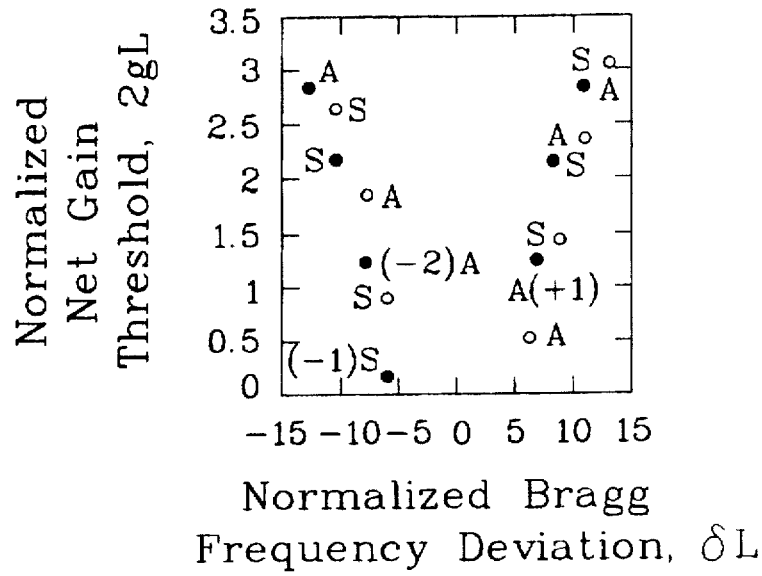
FIG. 2 is a graph illustrating the normalized net gain thresholds (2 gL) versus the normalized Bragg-frequency deviation ($\delta$L) for the first seven longitudinal modes for both a pure IC-DFB laser and an in-phase CC-DFB laser.

With reference to FIG. 2, the normalized net gain thresholds ($2gL$) versus the normalized Bragg-frequency deviation ($\delta L$) for the first seven longitudinal modes are illustrated for both a pure IC-DFB laser and an in-phase CC-DFB laser. The presence of a stopband and alternating near-field symmetry (i.e., symmetric/antisymmetric) are found for both structures. As expected, the lasing mode for the $2^{nd}$-order IC-DFB structure has an antisymmeyric near-field pattern. By contrast, the lasing mode for the $2^{nd}$-order CC-DFB structure is symmetric. Furthermore, the gain-threshold difference between the lasing mode and the nearest mode is much larger for the CC-DFB laser than that for the IC-DFB laser, resulting in higher single-mode yield as well as single-mode operation to higher power levels.

Figure 3:
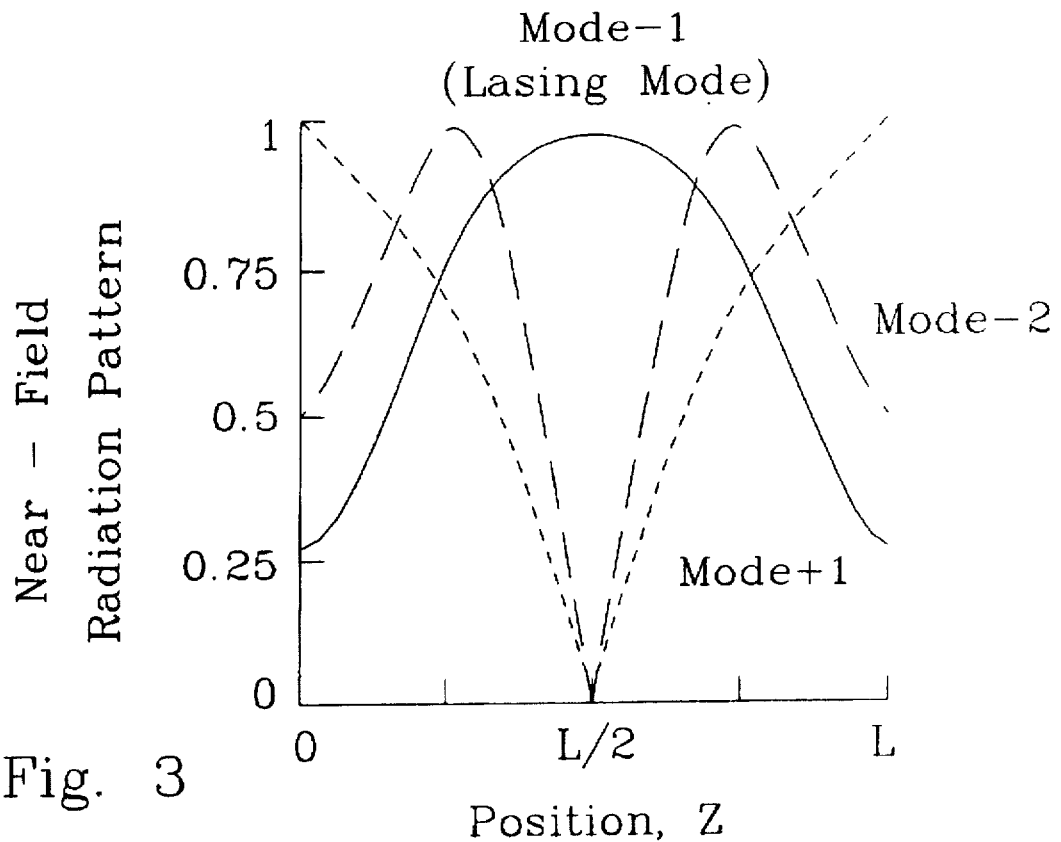
FIG. 3 are graphs illustrating the near-field radiation patterns of the three modes with the lowest gain threshold for an in-phase CC-DFB laser.
Figure 4:
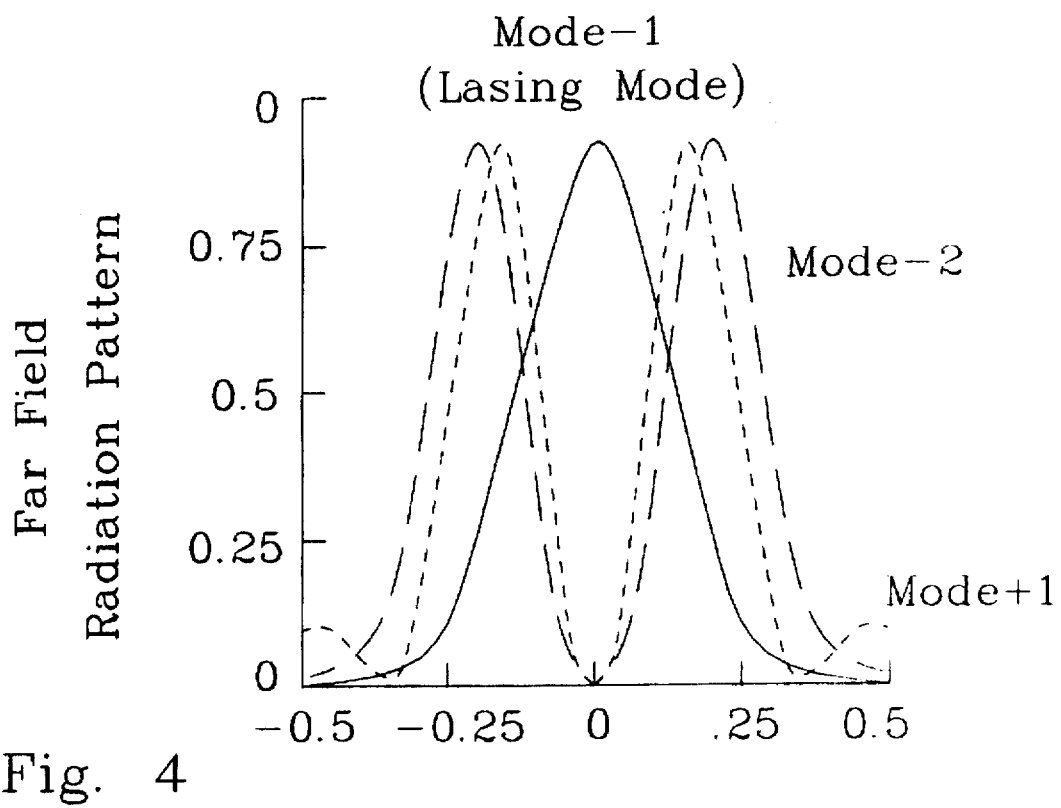
FIG. 4 are graphs illustrating the far-field radiation pattern of the three modes with the lowest gain threshold for an in-phase CC-DFB laser.

For the in-phase CC-DFB laser, the near- and far-field radiation patterns of three modes with the lowest gain threshold are shown in FIGS. 3 and 4, respectively. The salient feature of the $2^{nd}$-order CC-DFB laser is that the lasing mode has a symmetric near-field and a single-lobed far-field beam pattern. Another attractive feature of the device is the relatively high power radiation efficiency of the lasing mode. While for the IC-DFB structure the mode of lowest radiation efficiency is favored to lase, the lasing mode of the CC-DFB structure is the one with the largest radiation efficiency (e.g., 47% for this example). This is an indication of why the $2^{nd}$-order CC-DFB laser operates in a symmetric mode while the $2^{nd}$-order IC-DFB laser operates in an antisymmetric mode. For IC-grating devices, the mode discrimination mechanism is based on the amount of mode radiation loss. For CC-grating devices, the periodic gain modulation appears to favor the symmetric mode to lase in spite of its relatively high radiation losses indeed, for the present CC-DFB structures, when calculations are made of the standing-wave (gain) overlap factor, $K_g f_{st}$ as defined by David, et al., supra, pages 428–429, and Baets, et al., supra, pages 1794–1795, both of which are incorporated herein by reference, it is found that the symmetric mode has a significantly larger gain overlap factor value than the antisymmetric mode. This better modal gain overlap more than compensates, in this case, for the difference in radiation losses, and thus causes the symmetric mode to have the lowest gain threshold.

The condition for lasing in the symmetric mode can be expressed by starting from the expression for the modal gain at threshold, $g_{th}$, as follows:

$$g_{th} = \alpha_{end} + \alpha_{rad} - k_g f_{st} \tag{3}$$

where $\alpha_{end}$ represents the losses at the ends of the grating, $\alpha_{rad}$ represents the losses due to radiation, and $k_g f_{st}$ is (as defined above) the standing wave overlap factor. To have the symmetric mode lase preferentially over the antisymmetric mode, the $g_{th}$ value for the symmetric mode, $g_{th,S}$, should be less than the $g_{th}$ value for the antisymmetric mode, $g_{th,A}$, i.e.:

$$g_{th,S} < g_{th,A} \tag{4}$$

By using equation (3), and the fact that the end losses, $\alpha_{end}$, are the same for both the symmetric (subscript "S") and antisymmetric (subscript "A") modes, the following condition is arrived at:

$$(K_g f_{st})_S - (K_g f_{st})_A > \alpha_{rad,S} - \alpha_{rad,A} \tag{5}$$

That is, for the symmetric mode to be favored to lase, the modal-gain difference between symmetric and antisymmetric modes due to overlap with the gain/loss grating should overcome the modal-gain difference based on radiation losses. The condition expressed by equation (5) depends on the following factors which can be selected to satisfy these conditions: the position of the grating with respect to the active region, the effective index step differential, the local modal gain differential, the grating duty factor (relative widths of adjacent grating elements), and the grating length.

It may be noted that the example presented above for illustration has impractically high gain and index coupling coefficients. A similar analysis to that above for a realizable structure ($\Delta n = 0.017$, $\Delta g = 130$ cm$^{-1}$, where $\Delta n$ and $\Delta g$ are differences in effective refractive index and (transverse) modal gain, respectively, grating length=500 μm, emitted light wavelength in vacuum of 0.8 μm, and the high index region being 40% of the grating period) shows that the symmetric mode is favored with good gain discrimination (i.e., 11 cm$^{-1}$) against the nearest antisymmetric mode. It is noted that if $\Delta g < 30$ cm$^{-1}$, then an antisymmetric mode is favored to lase, just as for IC-DFB lasers.

Figure 5:
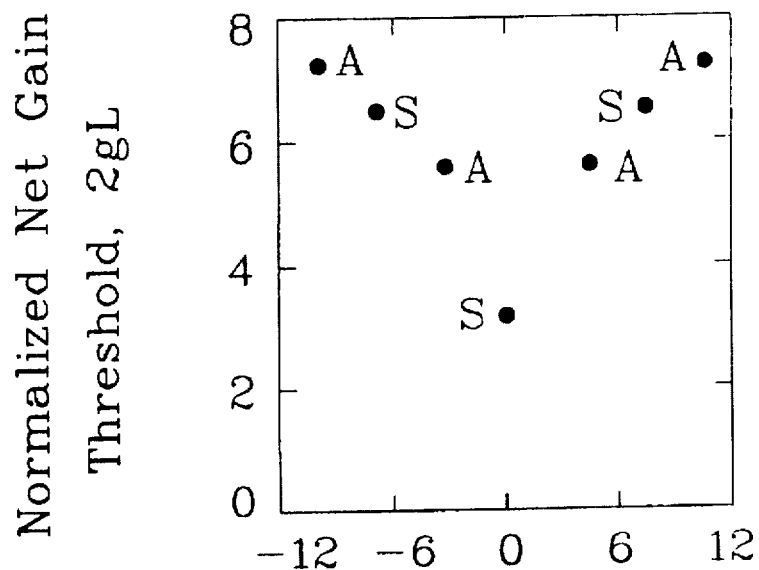
FIG. 5 is a plot illustrating the normalized net gain threshold versus the normalized Bragg-frequency deviation for the first seven longitudinal modes of an in-phase CC-DFB laser structure designed to perfectly meet the Bragg resonance condition.
Figure 6:
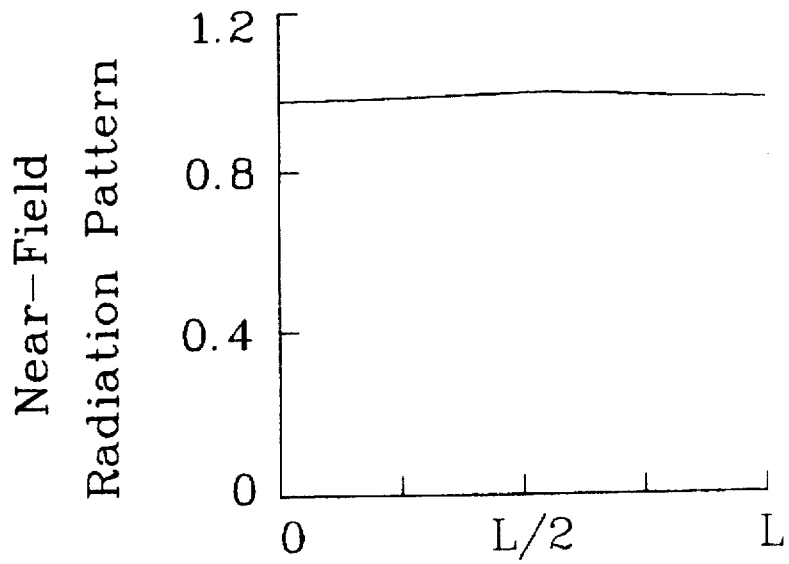
FIG. 6 is a graph of the near-field radiation pattern of the lasing mode of the example laser structure referred to in FIG. 5.
Figure 7:
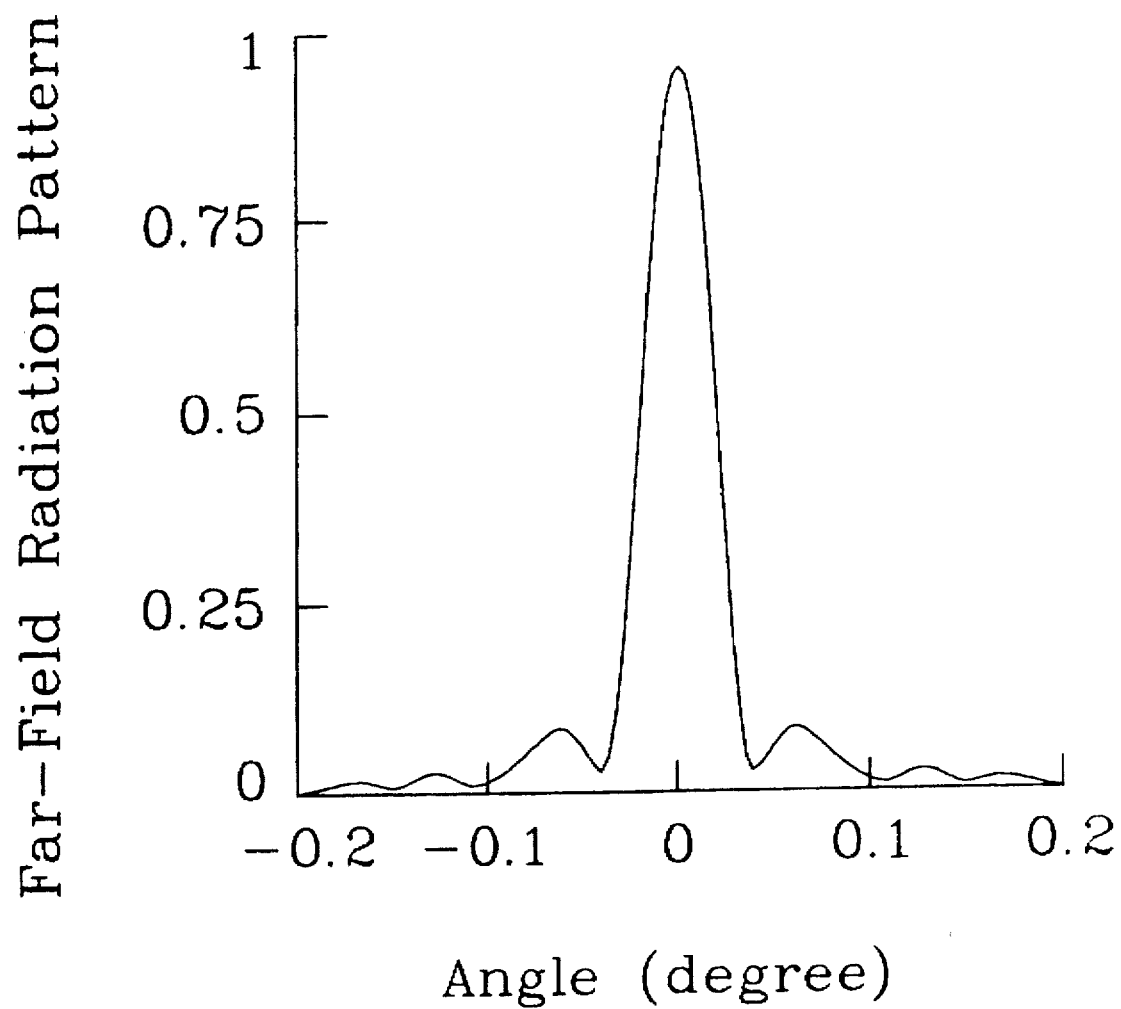
FIG. 7 is a graph of the far-field radiation pattern of the lasing mode for the laser referred to in FIG. 5.

Even though, for the example given, the near-field pattern of the lasing mode of the CC-DFB structure (see FIG. 3) is more uniform than that of the IC-DFB, it is not substantially uniform across the aperture. This nonuniformity of the near-field pattern can cause multimode operation due to GSHB at high output-power levels. From the coupling coefficient of the governing equations, it is noted that, for an appropriate length of the grating, a uniform near-field intensity profile can be obtained when the contribution of the first and second harmonics of the index corrugation cancel each other, resulting in a resonant condition for the lasing mode (i.e., oscillation exactly at Bragg frequency). See, D. L. Jaggard, et al., J. Opt. Soc. Am., Vol. 66, 1976, pp. 674, et seq. In such a case, the CC-DFB laser can behave similarly to a pure gain-coupled DFB structure or a resonant phase-locked antiguided (ROW) array. FIG. 5 depicts the normalized net gain threshold versus the normalized Bragg-frequency deviation for the first seven longitudinal modes of a 850 μm-long structure. A nearly symmetric mode spectrum, large gain-threshold differentials, and oscillation of a symmetric mode right at the Bragg frequency are clearly obtained. Also, due to the reduction of the index-coupling strength for this example, a large gain threshold for the lasing mode is observed. The corresponding near- and far-field radiation patterns of the lasing mode are shown in FIGS. 6 and 7, respectively. The uniform near-field pattern significantly reduces the possibility of GSHB occurrence, similar to what happens in a ROW array, e.g., R. F. Nabiev and D. Botez, "Comprehensive Above-Threshold Analysis of Antiguided Diode Laser Arrays," IEEE J. Sel. Topics Quantum Electron., Vol. 1, pp. 138–149, June 1995. The far-field radiation pattern has a single, narrow (due to long grating) main lobe with very small side lobes. Maximum intensity of the side lobes is about 5.5% of that of the main lobe. The radiation efficiency of the lasing mode for this structure is 34.5%. For this case, the radiation efficiency may be enhanced by increasing the gain-coupling strength and by altering the grating length. However, an increase in the grating length alone results not only in an increase of the radiation efficiency, but also a decrease in near-field pattern uniformity. This is because oscillation of the lasing mode occurs at a frequency slightly away from the Bragg frequency.

The present invention may also be applied as appropriate to anti-phase, $2^{nd}$-order CC-DFB devices. The analysis of ROW arrays indicates that such devices can also radiate in a single far-field lobe with an essentially uniform near-field pattern. That is, in-phase operating ROW arrays have been shown to be analogous to $2^{nd}$-order, lateral CC-DFB devices. See, C. A. Zmudzinsky, et al, Appl. Phys. Lett., Vol. 60, 1992, pp. 1049, et seq. Properly designed anti-phase, $2^{nd}$-order CC-DFB devices should operate like in-phase ROW arrays: essentially single-lobe and with uniform near-field intensity profile.

In summary, the foregoing provides results of a theoretical analysis of an in-phase complex-coupled DFB laser with a second-order grating. It is shown that the in-phase, $2^{nd}$-order or higher even-order CC-DFB laser structures will fundamentally provide orthonormal emission of light having a single-lobed far-field radiation pattern. Furthermore, structures designed to lase at the Bragg frequency provide a uniform near-field intensity pattern, and thus may be utilized for high-power, single-mode operation.

With reference to the drawings, exemplary implementations of the complex coupled DFB laser of the present invention are illustrated in FIGS. 8–14. In a first preferred embodiment, illustrated in cross section at 30 in FIG. 8, the semiconductor laser comprises a multilayer structure including an active region layer 31 having regions at which light generation occurs, which may have an SCH-MQW structure (e.g., layers of InGaAsP-100 nm and InGaAs-75 nm), cladding layers 32 (e.g., n-type InGaP) and 33 (e.g., p-type InGaP), a substrate 34 (e.g., GaAs) adjacent to the cladding layer 32, a n-type metal contact layer 35 on the surface of the substrate layer 34, with an opening 36 provided in the metal layer 35 to allow emission of light in a (single lobed) beam 37 from a planar face 38 of the semiconductor structure. Additionally, a current blocking layer 40 (e.g., n-type AlInP) is provided adjacent to the cladding layer 33 and with an opening 41 therein to allow passage of current to the active regions of the layer 31, a cladding layer 43 (e.g., p-type InGaP) over the layer 40 and in contact with the layer 33 at the area 41 (and which may be integrally formed with the layer 43), and a capping layer 45 (e.g., of p$^+$-GaAs) over the face surface 46 of the layer 43. A metal diffraction grating 47 is formed on the capping layer 45 at a position to extend above the opening 41 in the current blocking layer 40 so that it will overlay the active region at which light emission occurs and act upon the light from the active region. A layer 50 of conducting metal (e.g., TiPtAu) is formed over the grating 47 and the capping layer 45 to provide an electrical contact to the top face of the semiconductor layer structure and forms one electrode of the structure by which voltage can be applied to the structure, with the metal layer 35 providing the other electrode. Such multilayer semiconductor structures are produced by well known semiconductor fabrication techniques.

Figure 9:
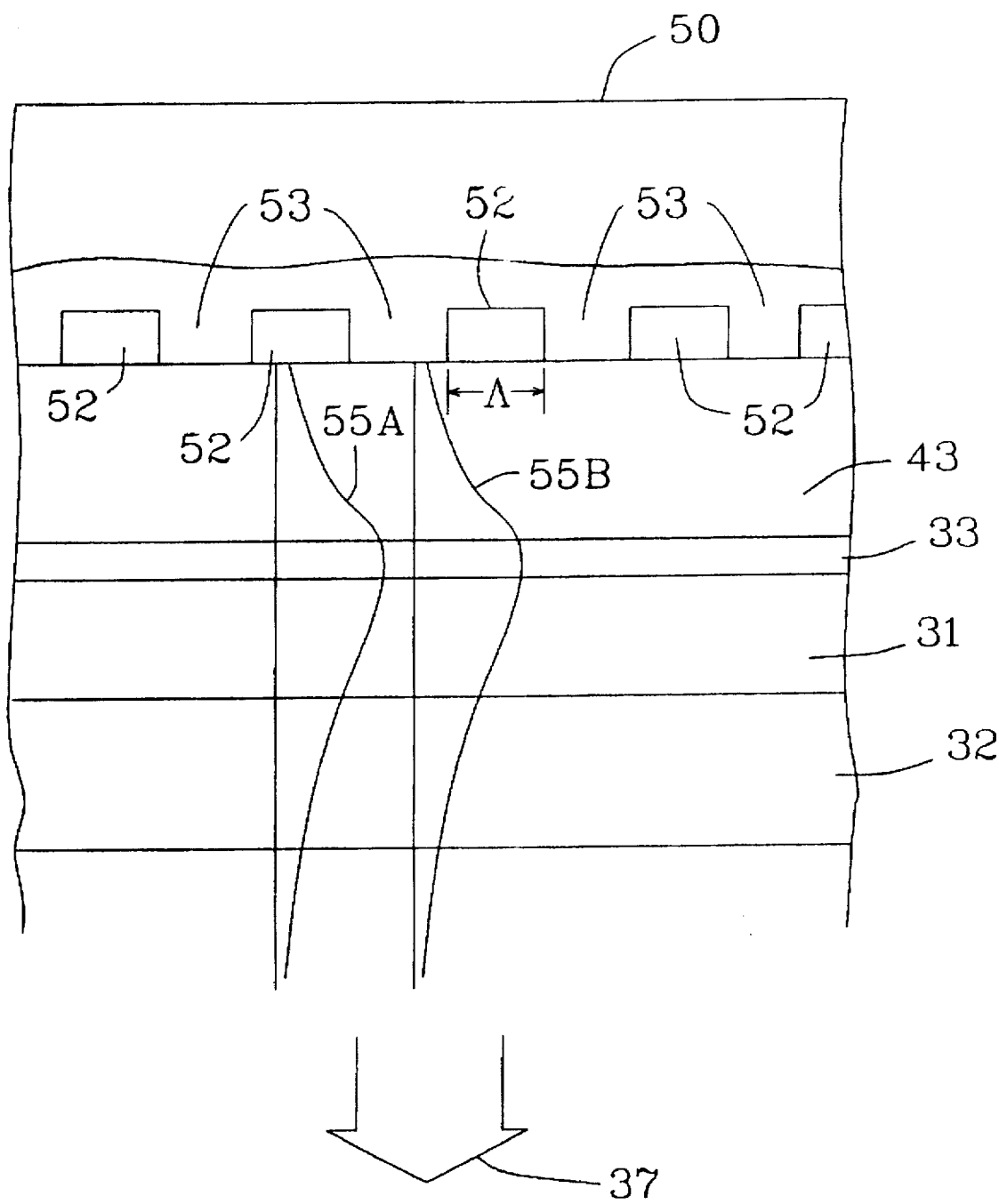
FIG. 9 is a cross-sectional view of the grating portion of the structure of FIG. 8 taken generally along the lines 9—9 of FIG. 8.

A cross-section of the grating 47 is shown in FIG. 9. This grating is formed of spaced strips 52 of a high index of refraction metal (e.g., Ni), with elements 53 of low index of refraction metal (e.g., Au) between the strips 52. The alternating strips of high index metal 52 and low index metal 53 form a regular periodic structure along the longitudinal length of the grating 47. The elements 52 and 53 also differ from each other in the degree to which they absorb light generated in the active layer 31. The width of each periodic element of the grating—comprising a low index strip 52 and an adjacent high index strip 53—is selected to be substantially equal to an integer multiple of the effective wavelength in the semiconductor structure of the light preferentially emitted by the active region. The period $\Lambda$ of the structure (i.e., the combined width of the elements 52 and 53) may be selected to be the wavelength $\lambda$ of light generated in the active region divided by the effective index of refraction, $n_{eff}$, of light in the semiconductor structure. The effective index of refraction in the semiconductor structure is determined in a standard manner. See, e.g., Govind P. Agrawal and Nilay K. Dutta, *Semiconductor Lasers* (book), Van Nostrand Reinhold, New York, 1993, pp. 41–43, generally and pp. 319–384 with respect to distributed feedback lasers. In general, in the present invention, the grating period $\Lambda$ may be selected in accordance with the standard relation:

$$\Lambda = \frac{m\lambda}{2n_{eff}}$$

where m is an even number. Thus, $\Lambda$ is selected to be equal to integer multiples of the effective wavelength in the semiconductor structure of the favored mode of light generation from the active region. For the exemplary structure of FIG. 8, the preferred period for a second order grating is $\Lambda=0.28$ μm. Under such conditions, lasing action occurs preferentially in the symmetric mode with the distribution of light intensity schematically, represented by the graphs 55 in FIG. 8 and 55A and 55B in FIG. 9, a direction normal to the planar faces 38 and 46 of the semiconductor structure 30, which are parallel to the active region layer 31, and the resulting emission of laser light is in a single far-field lobe schematically represented at 37 in FIG. 8. The grating 47 thus functions, as does the structure described with respect to FIG. 1, to interact with light generated in the active layer 31 to produce lasing action in a symmetric optical mode and emission of light from a face of the semiconductor structure in a direction normal to the face and the active region. As illustrated by the graph 55A in FIG. 9, the light intensity distribution extends into the low index metal strip 52 where it is partially absorbed, whereas, as illustrated by the graph 55B, the light is substantially reflected and not absorbed at the high index metal strip 53, providing an effective difference in gain (i.e., loss) between the regions 52 and 53.

Figure 10:
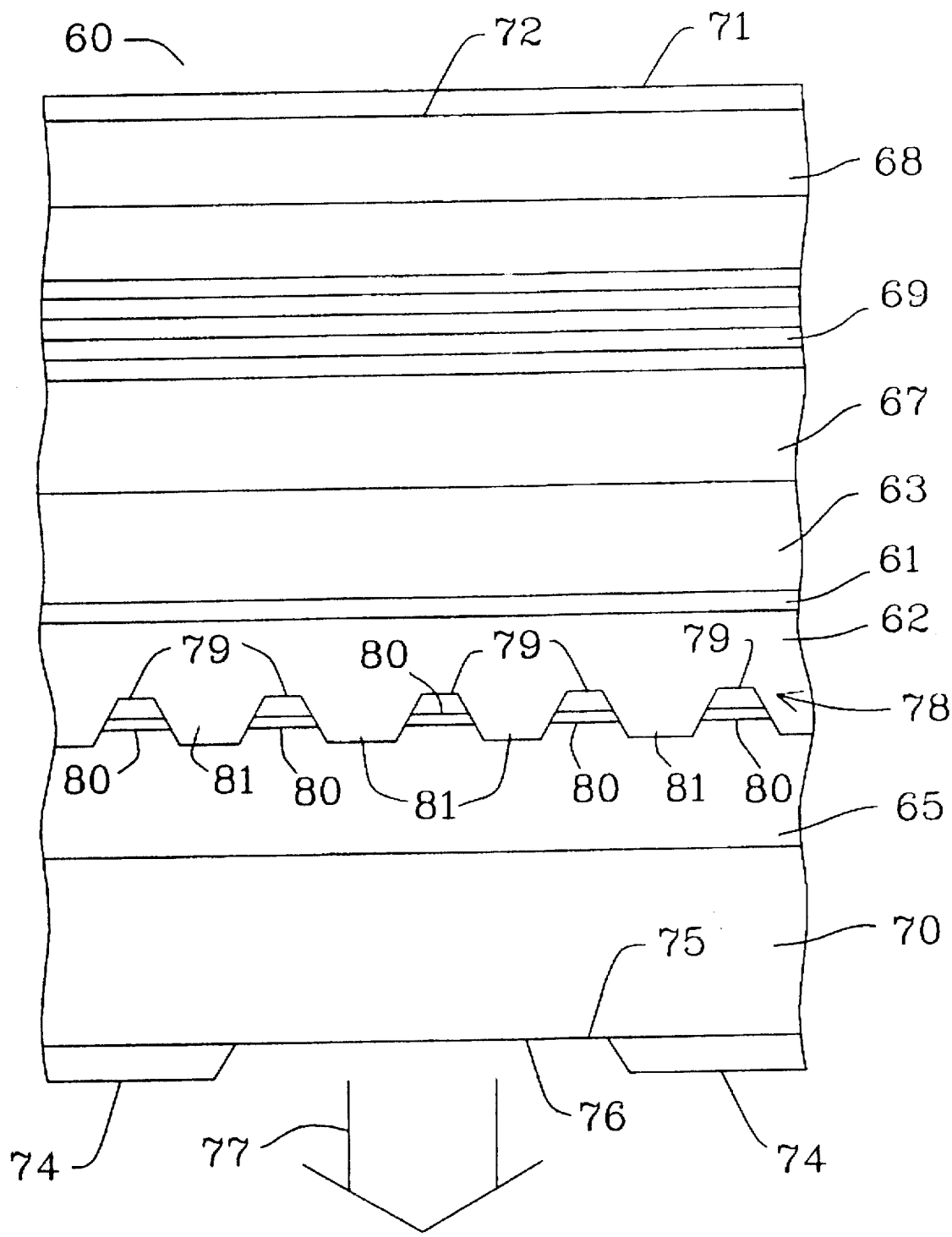
FIG. 10 is an illustrative cross-sectional view of another semiconductor laser structure in accordance with the invention which includes a distributed feedback grating formed in the semiconductor material itself utilizing quantum well absorbing layers.

Another semiconductor laser structure in accordance with the invention is shown generally in cross-section at 60 in FIG. 10. In this exemplary embodiment, an active layer 61 having an SQW-MQW structure (e.g., $In_{0.2}Ga_{0.8}As$ quantum-well layers) is interfaced with a lower cladding layer 62 (e.g., InGaAsP), and an upper cladding layer 63 (e.g., InGaAsP), with a further cladding layer 65 (e.g., n-type InGaP) interfaced with the layer 62, and a cladding layer 67 (e.g., p-type InGaP) interfaced with the layer 63, and a capping layer 68 (e.g., p$^+$-type GaAs) over the layer 67. A superlattice reflector 69 is formed of multiple layers of semiconductor in a conventional manner positioned to reflect light back toward the active layer 61. The superlattice reflector 69 is placed such as to reflect light directed towards the top face 72, and thus increases the device efficiency. The superlattice reflector position is such that the reflected light adds in phase with the light diffracted from the grating 78 towards the emitting face 76. See for example: D. Mehuys, A. Hardy, D. Welch, R. Waarts, and R. Parke, "Analysis of Detuned 2nd-Order Grating Output Couplers With an Integrated Superlattice Reflector," IEEE Photon. Tech. Letts., Vol. 3, pp. 342–344, April 1991. The cladding layer 65 is interfaced to a substrate 70 (e.g., GaAs), a metal contact layer 71 is formed on the top face 72 of the structure 60, at the top surface of the capping layer 68, to form one electrode at which current can be applied to the semiconductor device, and a second metal layer 74 is formed on the bottom face 75 of the structure, the bottom surface of the substrate 70, with an opening 76 formed in the metal layer 74 to allow the exit of a beam 77 of laser light. For increased efficiency, a superlattice-type reflector structure may be included in the cladding layer 65. In the semiconductor laser structure 60, an integral semiconductor distributed feedback diffraction grating 78 is formed between the layers 62 and 65, and is composed of alternating elements 79 which have high absorption (e.g., by forming $In_{0.2}Ga_{0.8}As$ layers 80 therein which increase absorption and reduce the gain in the regions 80). The elements 81 between the elements 79 are formed of the same material as the cladding layer 62, and preferably are formed integrally therewith (e.g., of InGaAsP). The refractive index of the elements 79 and 81 also differs, so that the grating 78 is composed of periodically repeating elements which differ in both refractive index and gain. The period $\Lambda$ of the grating, that is, the width of each pair of elements 79 and 81, is selected to satisfy the second order Bragg condition, that is, $\Lambda = \lambda/n_{\it eff}$ (or a multiple thereof, i.e., $\Lambda = m\lambda/2n_{\it eff}$ where m is an even number). For the exemplary structure in which the emitted wavelength of light $\lambda = 0.98$ μm, $\Lambda$ is preferably approximately equal to 3,000 angstroms (Å). This structure again results in lasing action and a preferential symmetric mode with the resulting emission of a single lobed far-field beam of laser light 77 in a direction perpendicular to the faces 72 and 76 of the semiconductor structure 60 and perpendicular to the plane of the layer in which the grating 78 generally lies.

The structure in FIG. 10 is an anti-phase type CC-DFB structure. Alternatively, an in-phase CC-DFB structure can be made by periodic etching into a quantum-well structure, e.g., as described in H. Lu, et al., "High-power and high-speed performance of 1.3 μm strained MQW gain-coupled DFB laser," IEEE J. Sel. Topics Quantum Electron., Vol. 1, pp. 375–381, June 1995.

Figure 11:
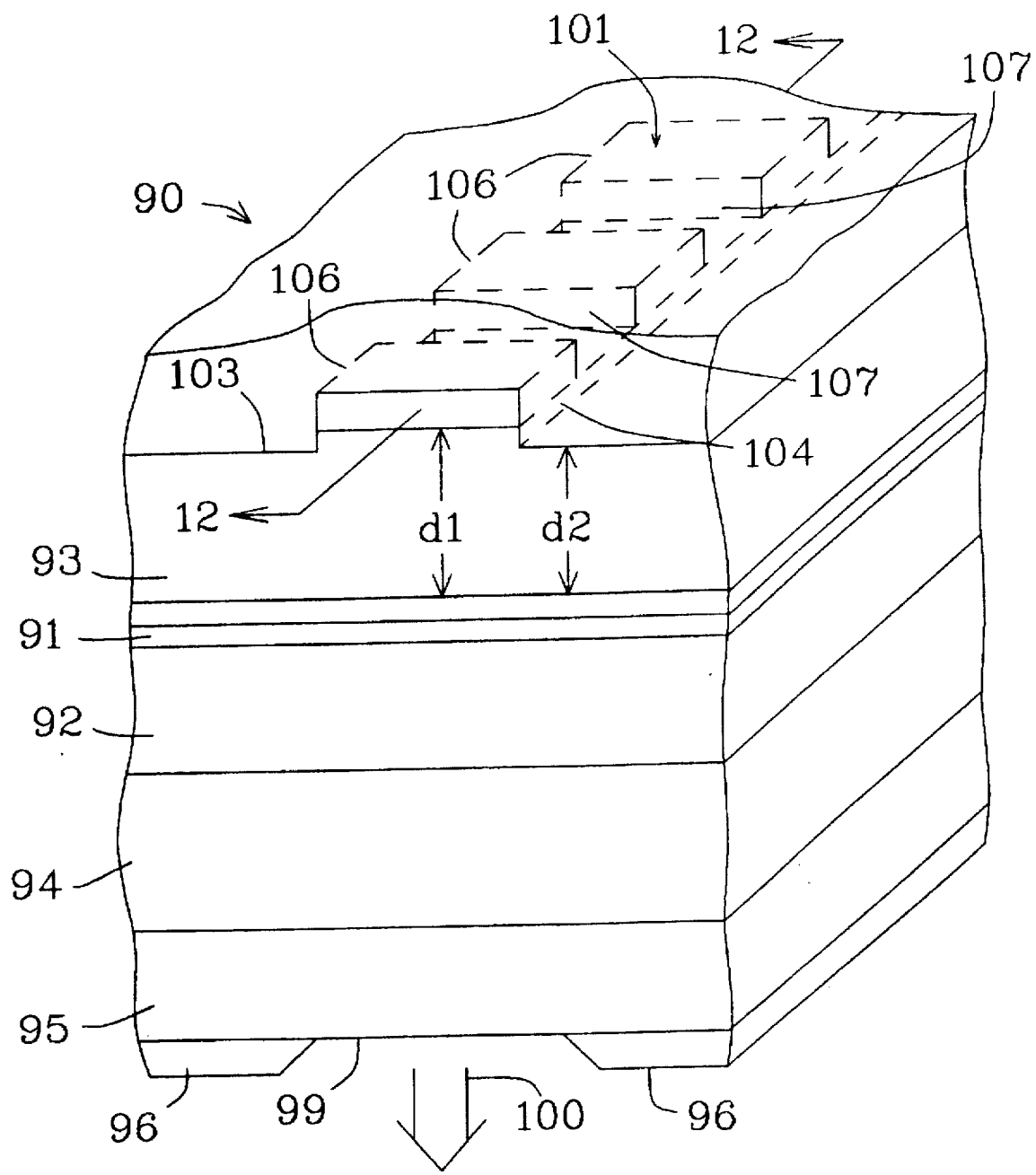
FIG. 11 is an illustrative cross-sectional view of another semiconductor laser structure in accordance with the invention incorporating a distributed feedback grating meeting the conditions of the present invention formed of strips of semiconductor.
Figure 12:
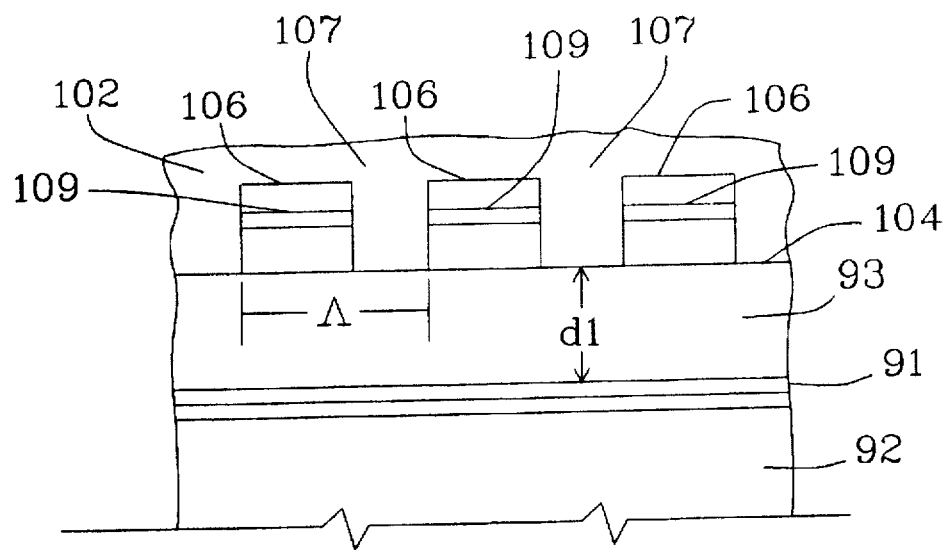
FIG. 12 is a cross-sectional view of the grating portion of the device of FIG. 11, taken generally along the lines 12—12 of FIG. 11.

A further embodiment of a semiconductor laser structure in accordance with the invention is shown generally in cross-section at 90 in FIG. 11. The structure 90 has an active layer 91, of an SCH-MQW structure (e.g., layers of InGaAs interfaced with layers of InGaAsP), a bottom cladding layer 92 (e.g., n-type InGaP), an upper cladding layer 93 (e.g., p-type InGaP), a further lower cladding layer 94 (e.g., n-type GaAs), a substrate 95 (e.g., GaAs), and a metal layer 96 formed on the bottom surface 97 of the substrate 95 which forms a bottom face of the semiconductor structure 90. An opening 99 is formed in the metal layer 96 to allow emission of a beam of laser light 100 from and perpendicular to the bottom face 97 of the structure.

A distributed feedback grating 101 is formed at the top of the structure 90, integrated with the layer 93. A layer 102 of conductive metal (e.g., Au) is formed over the grating 101 and over the top surface 103 of the layer 93, which forms a top face of the semiconductor structure 90. With reference also to the cross-sectional view through the grating 101 of FIG. 12, the grating 101 is formed on a raised plateau 104 extending upwardly from the adjacent top surface 103 of the layer 93, with the plateau 104 being formed of the same material as the layer 93 (e.g., p-type InGaP). Exemplary preferred dimensions for the spacing $d_1$ (as illustrated in FIG. 11) between the bottom surface of the layer 93 (where it interfaces the active layer 91) and the top of the plateau 104 is about 0.5 μm for the material system described above, and the distance $d_2$ between the bottom surface of the layer 93 (where it interfaces the active layer 91) and the top surface 103 of the layer 93 is about 0.4 μm. The grating 101 is formed of spaced elements 106 on the plateau region 104 separated by regions 107 which are formed by the material of the layer 102 (e.g., Au). The elements 106 may be formed of a semiconductor (e.g., $p^+$-type GaAs) with a thin layer 109 therein of an absorbing material (e.g., a 150 Å thick layer of InGaAs). Exemplary dimensions for the grating 101 as shown with the materials described above is a width of the grating 101 of about 4 μm, which insures single spatial-mode operation in the lateral dimension, a height of the grating elements 106 above the adjacent surface of the plateau 104 of about 0.2 μm, a width of the elements 106 of about 0.13 μm, and a width of the interelement sections 107 of about 0.17 μm. The $\Lambda$ of the grating 101, i.e., the combined widths of the elements 106 and 107, is thus about 0.30 μm to correspond with the effective wavelength in the grating of the light emitted from the active regions of the layer 91.

Figure 13:
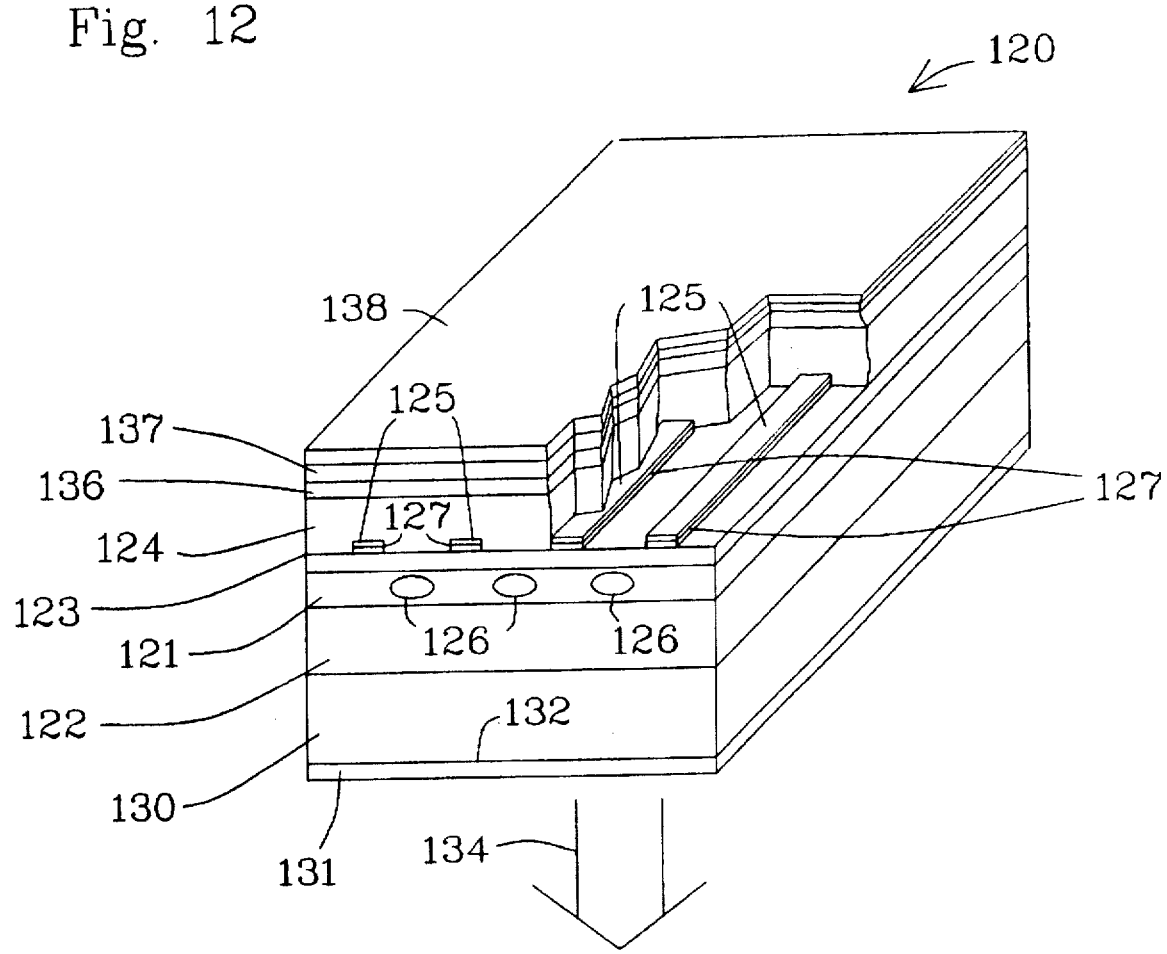
FIG. 13 is an illustrative partial perspective view of a semiconductor laser device in accordance with the invention with a resonant phase-locked array and large-area surface emission.

A semiconductor laser structure in accordance with the invention which incorporates a lateral phase-locked array is illustrated in a partial perspective and broken away view at 120, in FIG. 13. The semiconductor structure 120 includes an active layer 121 which may be SL SQW, or SCH-type, a lower cladding layer 122 (e.g., n-type InGaP), an upper cladding layer 123 (e.g., p-type InGaP) in contact with the active layer 121, and a cladding layer 124 (e.g., p-type InGaP) over the cladding layer 122, an array of laterally extending spaced strips 125 of semiconductor (e.g., GaAs) which may have an absorbing quantum well layer 127 (e.g., InGaAs) therein for providing interelement loss, formed between the layers 123 and 124 to define the optical mode active regions 126 in the active layer 121 between them (e.g., a resonant negative-index or antiguided array with the strips 125 defining the antiguide elements between them), a substrate 130 beneath the cladding layer 122, a bottom metal layer 131 formed on the bottom surface 132 of the substrate 130 to form a bottom electrode, with a rectangular area (not shown) of the metal layer 131 opened up to expose the bottom surface 132 (forming the bottom face of the semiconductor structure), and allowing the emission of laser light in a beam 134 from the bottom face of the structure.

Figure 14:
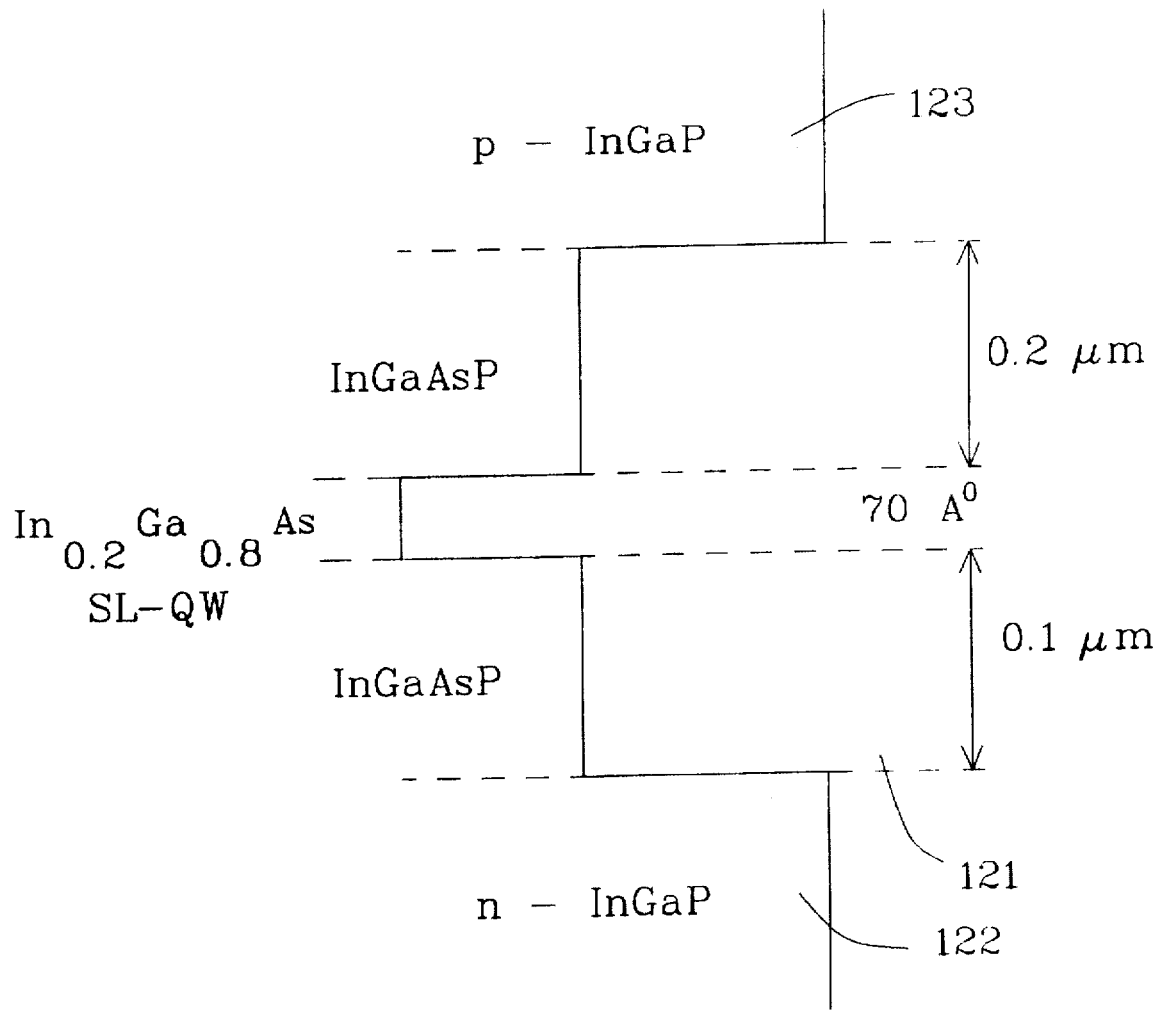
FIG. 14 is an illustrative diagram showing an example composition for the active layer for the device of FIG. 13.

A capping layer 136 (e.g., $p^+$-type GaAs) is formed over the cladding layer 124, and a layer 137 which incorporates a diffraction grating therein is formed on the layer 136. A metal electrode layer 138 is formed over the diffraction grating layer 137. An exemplary SL-SQW-SCH active layer 121 is schematically illustrated in FIG. 14. Suitable dimensions for this structure include a width of the array of 100–200 μm, and a grating length, along a direction perpendicular to the array width and the strips of the array, of 300–1000 μm.

Figure 8:
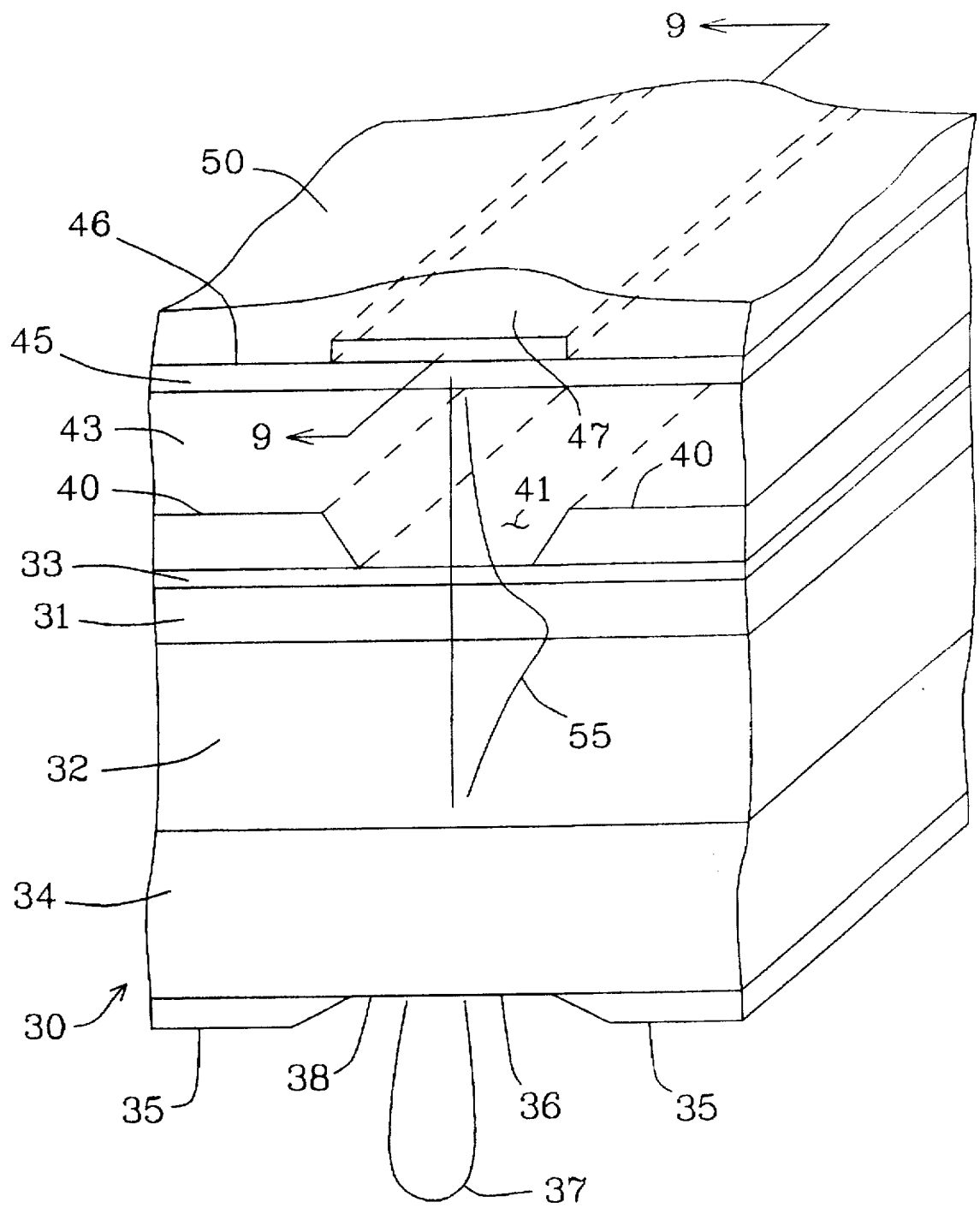
FIG. 8 is an illustrative cross-sectional view of a semiconductor laser structure in accordance with the present invention incorporating a metal grating formed on a surface of the semiconductor material which meets the conditions of the present invention.

In the semiconductor laser structure 120, the diffraction grating 137 may be formed in various ways, for example, as the diffraction grating 47 of FIG. 8 or the diffraction grating 101 of FIG. 11. Alternatively, a grating structure may be formed in the semiconductor itself as illustrated by the diffraction grating 78 of FIG. 10. The elements of the grating are oriented perpendicular to the spaced strips 125 of the array. The adjacent diffraction grating elements vary in both gain and refractive index as described above, and have a combined width of the adjacent elements which form the periodically repeating structure selected to be equal to the effective wavelength of the emitted light in the distributed feedback diffraction grating, or multiples of the wavelength. Under such circumstances, a large area beam 134 will be emitted from the bottom face 132 of the semiconductor structure as a result of the emission of light in the array of active regions 126, with the light from each region interacting with the distributed feedback diffraction grating 137 as discussed above. The resonant antiguided array insures single spatial-mode operation in the lateral dimension with a near-field profile that is substantially uniform, and thus not affected by gain spatial hole burning. The result is preferential lasing in a symmetric mode in both dimensions. In this manner, a very large area surface emitting laser structure may be formed to provide a two-dimensional emitted beam which is diffraction-limited, has a substantially uniform two-dimensional near-field intensity profile, and is stable to very high output power levels.

Although the invention has been illustrated above for exemplification with particular material systems, it is apparent that the invention may be used with other semiconductor laser material systems. For example, the invention is particularly advantageous for GaN systems, since emission takes place at a planar surface and cleaving of crystal facets to form end mirrors is not required, and metal gratings may be readily formed on the surfaces of such materials.

It is understood that the invention is not confined to the particular embodiments set forth herein as illustrative, but embraces all such modified forms thereof as come within the scope of the following claims.

What is claimed is:

1. A semiconductor laser comprising:

(a) a semiconductor structure including a substrate, a layer with an active region at which light emission occurs, cladding layers surrounding the active region, and outer faces, and electrodes by which voltage can be applied across the semiconductor structure;

(b) a distributed feedback diffraction grating comprising periodically alternating elements, the adjacent elements in the grating differing from one another both in index of refraction and in gain, thereby providing a variation in gain and index of refraction in the grating, each pair of adjacent elements having a width substantially equal to integer multiples of the effective wavelength in the semiconductor structure of the favored mode of light generation from the active region, the grating formed and positioned such that the modal-gain difference between symmetric and antisymmetric modes due to overlap with gain variation of the grating overcomes the modal gain difference based on radiation losses to act upon the light generated in the active region to produce lasing action in the symmetric mode and emission of light in a single lobe pattern from an outer face of the semiconductor structure that is formed such that emission of light occurs in a direction normal to the face and to the active region layer.

2. The semiconductor laser of claim 1 wherein the grating is formed on a surface of a semiconductor layer in the semiconductor structure and has alternating strips of metals which differ from each other in both index of refraction and in absorption of emitted light.

3. The semiconductor laser of claim 2 wherein the metals of the alternating strips forming the diffraction grating are Ni and Au.

4. The semiconductor laser of claim 2 wherein one electrode is formed of a layer of metal deposited on the semiconductor structure over and covering the grating and onto the surface of the semiconductor layer on which the metal grating is formed.

5. The semiconductor laser of claim 4 wherein the electrode on the other outer face of the semiconductor structure is formed as a metal layer deposited on the surface of a layer of semiconductor and having an opening in the metal layer beneath the active region and beneath the position of the grating so that light can be emitted from the face of the semiconductor structure at the opening.

6. The semiconductor laser of claim 2 wherein the active region layer is formed of layers of InGaAsP, InGaAs, and InGaAsP, the cladding layers are formed of n-type InGaP and p-type InGaP, and the substrate is formed of GaAs.

7. The semiconductor laser of claim 6 further including a blocking layer formed of a material including n-type AlInP in the P-type InGaP cladding layer, the blocking layer having an opening therein under the position of the grating to allow current to flow to the active region, to allow light emitted from the active region to be acted upon by the grating, and to insure operation in a single lateral spatial mode.

8. The semiconductor laser of claim 6 wherein the elements of the grating are formed of alternating elements of Au and Ni, and wherein the width of each pair of adjacent elements is approximately 0.28 µm.

9. The semiconductor laser of claim 1 wherein the width of each pair of adjacent elements in the diffraction grating is selected to be equal to the wavelength of the light emitted from the active region divided by the effective index of refraction of the semiconductor structure.

10. The semiconductor laser of claim 1 wherein the diffraction grating is integrally formed in the semiconductor structure of alternating elements of semiconductor material, one of each pair of adjacent elements having at least one quantum well absorbing layer formed therein such that the adjacent elements of the grating differ in both index of refraction and gain.

11. The semiconductor laser of claim 10 wherein the active region layer is formed of layers of InGaAsP and $In_{0.2}Ga_{0.8}As$, the cladding layers are formed of n-type InGaP and p-type InGaP, and the grating is formed between the active region layer and a cladding layer by alternating elements in the grating formed of material from the active region layer and the cladding layer, and wherein one of each pair of adjacent elements has at least one quantum well absorbing layer formed of $In_{0.2}Ga_{0.8}As$ formed therein such that the index of refraction and gain of adjacent elements in the diffraction grating differs in the adjacent elements.

12. The semiconductor laser of claim 11 wherein the active region emits light at a wavelength of 0.98 µm and the combined width of each adjacent pair of elements in the grating is approximately 3000 Å.

13. The semiconductor laser of claim 1 wherein the diffraction grating is formed adjacent a face of the semiconductor structure on a raised plateau above the adjacent face surface of the semiconductor material, the grating formed as alternating elements of semiconductor and metal.

14. The semiconductor laser of claim 13 wherein each of the semiconductor elements of the grating includes a thin layer of a quantum well absorber in the semiconductor element to provide a desired index of refraction and gain for the semiconductor element.

15. The semiconductor laser of claim 14 wherein the semiconductor elements are formed of $p^+$-type GaAs, the quantum well layers in the semiconductor elements are formed of InGaAs, and wherein the metal elements of the grating are Au and are formed as a portion of a layer of Au which is depositable over the grating and the adjacent surfaces of the semiconductor structure to form one of the electrodes.

16. The semiconductor laser of claim 15 wherein the active region layer is formed of multiple layers of InGaAs and InGaAsP, and the cladding layers are formed of n-type InGaP and p-type InGaP.

17. The semiconductor laser of claim 1 including an array of strips of semiconductor formed in the semiconductor structure and defining a resonant array of antiguide elements in a cladding layer adjacent to the active region layer which operates in an in phase lateral spatial mode.

18. The semiconductor laser of claim 17 wherein the active region layer is comprised of layers of InGaAsP and $In_{0.2}Ga_{0.8}As$, the cladding layers are formed of n-type InGaP and p-type InGaP, and the strips of the resonant array are formed of GaAs and InGaAs quantum well absorbing layers.

19. A semiconductor laser comprising:
 a semiconductor structure including a substrate, a layer with an active region at which light emission occurs, cladding layers surrounding the active region, and outer faces, and electrodes by which voltage can be applied across the semiconductor structure, and
 distributed feedback diffraction grating means having a variation in gain and index of refraction for interacting with the light generated in the active region, such that the modal-gain difference between symmetric and anti-symmetric modes due to overlap with gain variation of the grating means overcomes the modal-gain difference based on radiation losses, to produce lasing action in the symmetric mode and emission of light in a single lobe pattern from an outer face of the semiconductor structure that is formed such that emission of light occurs in a direction normal to the face and to the active region layer.

20. The semiconductor laser of claim 19 wherein the distributed feedback grating means comprises an even order distributed Bragg diffraction grating formed of periodically alternating elements differing from one another in both index of refraction and in gain.

21. The semiconductor laser of claim 20 wherein the grating is a second order grating.

22. The semiconductor laser of claim 20 wherein the width of each pair of adjacent elements in the diffraction grating is selected to be equal to the wavelength of the light emitted from the active region divided by the effective index of refraction in the semiconductor structure.

23. The semiconductor laser of claim 22 wherein the diffraction grating is integrally formed in the semiconductor structure of alternating elements of semiconductor material, one of each pair of adjacent elements having at least one quantum well absorbing layer formed therein such that the adjacent elements of the grating differ in both index of refraction and gain.

24. The semiconductor laser of claim 19 including an array of strips of semiconductor formed in the semiconductor structure and defining a resonant array of antiguide elements in a cladding layer adjacent to the active region layer which operates in an in-phase lateral spatial mode.

\* \* \* \* \*